United States Patent
Ott

(10) Patent No.: US 7,023,248 B2
(45) Date of Patent: Apr. 4, 2006

(54) HIGH VOLTAGE TOLERANT POWER UP DETECTOR

(75) Inventor: Patrick J. Ott, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 45 days.

(21) Appl. No.: 10/856,261

(22) Filed: May 27, 2004

(65) Prior Publication Data

US 2005/0264329 A1  Dec. 1, 2005

(51) Int. Cl.
*H03L 7/00* (2006.01)

(52) U.S. Cl. ..................... 327/143

(58) Field of Classification Search .............. 327/142, 327/143, 198
See application file for complete search history.

(56) References Cited

U.S. PATENT DOCUMENTS

| | | | | |
|---|---|---|---|---|
| 5,214,316 A | * | 5/1993 | Nagai | 327/143 |
| 5,717,354 A | * | 2/1998 | Kim et al. | 327/309 |
| 6,078,201 A | * | 6/2000 | Crotty | 327/143 |
| 6,469,551 B1 | * | 10/2002 | Kobayashi et al. | 327/143 |
| 6,593,790 B1 | * | 7/2003 | Kim | 327/198 |
| 6,674,311 B1 | * | 1/2004 | Utsunomiya | 327/58 |
| 6,791,373 B1 | * | 9/2004 | Oyama | 327/78 |
| 6,806,747 B1 | * | 10/2004 | Honda et al. | 327/108 |
| 6,885,232 B1 | * | 4/2005 | Chonan | 327/313 |
| 2005/0195000 A1 | | 9/2005 | Parker et al. | |

* cited by examiner

*Primary Examiner*—Jeffrey Zweizig
(74) *Attorney, Agent, or Firm*—Blakely, Sokoloff, Taylor & Zafman LLP

(57) ABSTRACT

A high voltage tolerant ("HVT") power up detector. The HVT power up detector includes a voltage detector circuit coupled to a high voltage tolerant transistor ("HVTT"). The voltage detector circuit determines when a voltage supply is above a threshold logic level voltage. The HVTT has a gate coupled to receive a logic level voltage and a source and a drain to couple between the voltage supply and the voltage detector circuit. The HVTT shelters the voltage detector circuit from voltages above the logic level voltage when the voltage supply exceeds the logic level voltage.

21 Claims, 4 Drawing Sheets

US 7,023,248 B2

HIGH VOLTAGE TOLERANT POWER UP DETECTOR

TECHNICAL FIELD

This disclosure relates generally to power up detectors, and in particular but not exclusively, relates to a high voltage tolerant power up detector.

BACKGROUND INFORMATION

Power up detectors are circuits used to determine when a power supply has reached a certain minimum voltage. When a power supply is turned on it does not instantaneously reach its steady state operating voltage level. Rather, for a finite start up period or charging phase, the output of the power supply rises monotonically towards its operating voltage as it charges the load capacitance coupled to its output.

During this start up period, the voltage level of the power supply may not be sufficiently high enough to properly operate digital logic. As such, digital logic may not correctly resolve operands and propagate erroneous results from one stage to the next. Power up detectors are used to disable digital logic during this start up period until the power supply has reached a threshold logic level voltage below which the digital logic cannot be guaranteed to operate properly. Once the threshold logic voltage level has been reached, the power up detector enables the digital logic to commence normal operation.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments of an apparatus and system to implement a high voltage tolerant power up detector are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
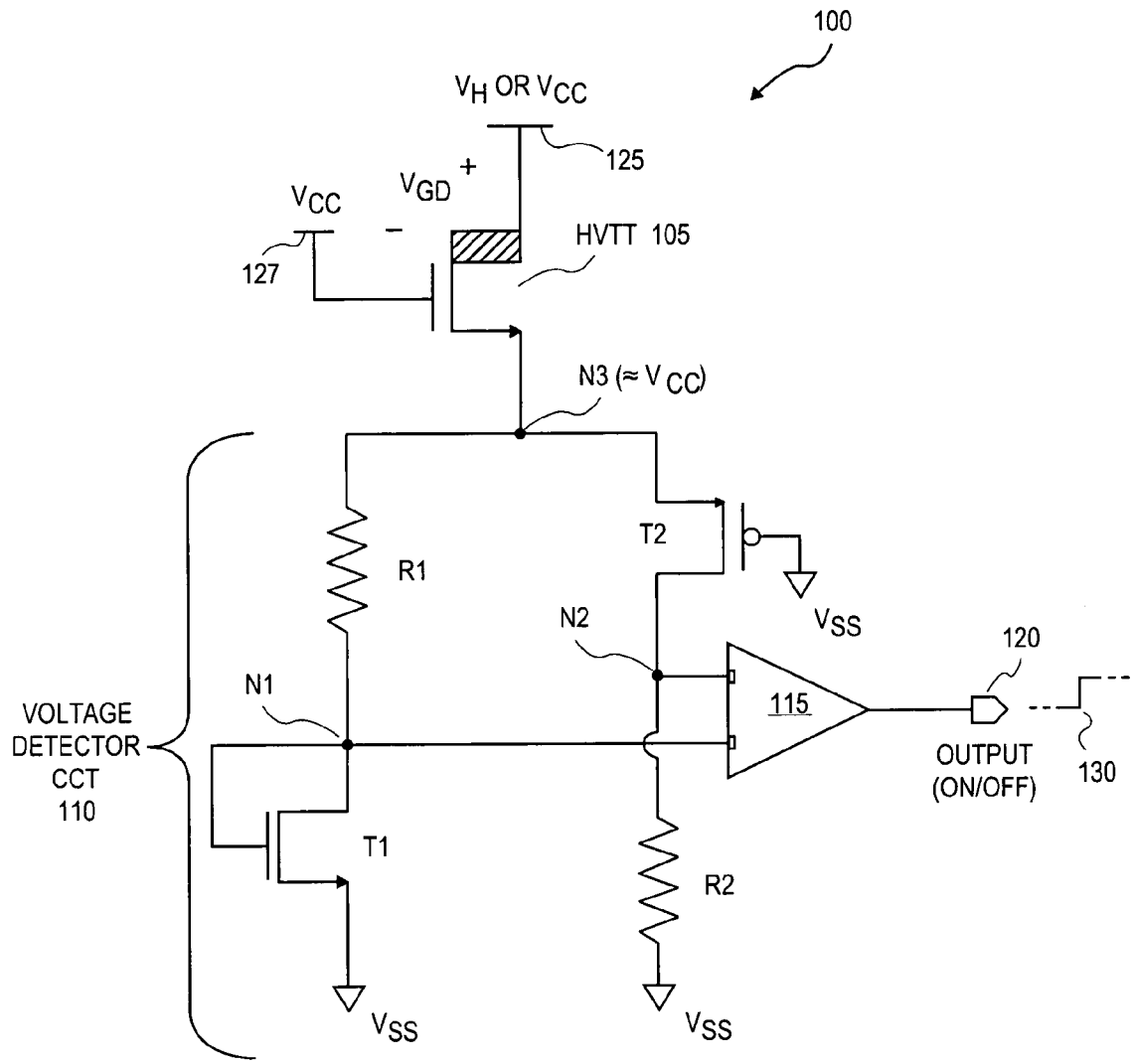
FIG. 1 is a circuit diagram illustrating a high voltage tolerant power up detector, in accordance with an embodiment of the present invention.

FIG. 1 is a circuit diagram illustrating a high voltage tolerant ("HVT") power up detector 100, in accordance with an embodiment of the present invention. The illustrated embodiment of HVT power up detector 100 includes a high voltage tolerant transistor ("HVTT") 105 and a voltage detector circuit 110. The illustrated embodiment of voltage detector circuit 110 includes resistive elements R1 and R2, transistors T1 and T2, a comparator 115, and an output 120.

The components of HVT power up detector 100 are interconnected as follows. A drain of HVTT 105 is coupled to a power rail or supply path 125. Power rail 125 may subsequently be coupled to a high voltage supply to provide a high level voltage $V_H$ or coupled to a logic voltage supply to provide a logic level voltage $V_{CC}$. A source of HVTT 105 is coupled to a node N3 of voltage detector circuit 110. A gate of HVTT 105 is coupled to a power rail 127. In one embodiment, power rail 127 is coupled to a logic voltage supply to provide $V_{CC}$ to the gate of HVTT 105.

Resistive element R1 and transistor T1 are coupled in series between node N3 and ground rail $V_{SS}$, which is a return path for the voltage supplies. A first end of resistive element R1 is coupled to node N3 and a second end is coupled to a first terminal of transistor T1. A second terminal of transistor T1 is coupled to $V_{SS}$. In one embodiment, transistor T1 is a negative type metal oxide semiconductor ("NMOS") transistor. In one embodiment, a drain of transistor T1 is coupled to the second end of resistive element R1 and a source of transistor T1 is coupled to $V_{SS}$. In the illustrated embodiment, transistor T1 is diode coupled having its gate and drain shorted together.

Transistor T2 and resistive element R2 are also coupled in series between node N3 and $V_{SS}$. One end of transistor T2 is coupled to node N3 and the other end coupled to a first side of resistive element R2. A second side of resistive element R2 is coupled to $V_{SS}$. In one embodiment, transistor T2 is a positive type MOS ("PMOS") transistor having a gate coupled to $V_{SS}$, a source coupled to node N3 and a drain coupled to the first side of resistive element R2.

Resistive element R1 and transistor T1 together form a first current path between node N3 and $V_{SS}$. Transistor T2 and resistive element R2 together form a second current path between node N3 and $V_{SS}$. In the illustrated embodiment, these two current paths are in parallel. Comparator 115 has a first input coupled to a node N1 within the first current path and a second input coupled to a node N2 within the second current path. In the illustrated embodiment, node N1 is located between the resistive element R1 and the drain of transistor T1 and node N2 is located between the drain of transistor T2 and resistive element R2.

Comparator 115 compares a first electrical parameter at node N1 against a second electrical parameter at node N2 to generate an output signal 130 used to enable or disable digital logic within an integrated circuit. In one embodiment, comparator 115 is a voltage comparator that measures and compares the voltages at nodes N1 and N2. By appropriate selection of resistive elements R1 and R2, voltage detector circuit 110 can be made to trigger output signal 130 at varying voltages for node N3. In one embodiment, resistive elements R1 and R2 are selected such that output signal 130 transitions from low to high (or high to low) when node N3 is approximately equal to a threshold logic level voltage $V_{TH}$ for digital logic of an integrated circuit.

Node N3 is approximately equal to the voltage applied to the gate of HVTT 105, less the gate-source junction voltage of HVTT 105. Therefore, a determination that node N3 has risen sufficiently high enough to operate digital logic is a determination that logic level voltage $V_{CC}$ applied to the gate of HVTT 105 is at or above $V_{TH}$. Furthermore, HVTT 105 will not conduct current from power rail 125 through to node N3, unless power rail 125 is at or above the voltage applied to the gate of HVTT 105. Therefore, HVT power up detector 100 not only acts to determine when $V_{CC}$ applied to the gate of HVTT 105 is at or above $V_{TH}$, but also when the voltage applied to power rail 125 is at or above $V_{TH}$. In one embodiment, a logic voltage supply is coupled to both the gate of HVTT 105 and to power rail 125 to provide $V_{CC}$ thereto. In another embodiment, a high voltage supply is coupled to power rail 125 to provide a high level voltage $V_H$ thereto. In one embodiment, power rail 125 is switchably coupled to either the high voltage supply generating $V_H$ or the logic voltage supply generating $V_{CC}$.

In one embodiment, HVTT 105 is a high voltage tolerant negative-metal oxide semiconductor ("NMOS") transistor. In one embodiment, HVTT 105 is a LDDNMOS (lightly doped drain NMOS). Typically, in a LDDNMOS transistor the interface between the drain and the gate has decreased dopant concentration that in turn reduces the E-field across the drain/gate interface. A reduction in the E-field enables the LDDNMOS to tolerate substantially increased gate-drain voltages $V_{GD}$. Therefore, in one embodiment, if power rail 125 exceed $V_{CC}$ applied to the gate of HVTT 105, the gate to drain voltage $V_{GD}$ will increase, but node N3 will remain substantially equal to the voltage applied to the gate of HVTT 105 (e.g., $V_{CC}$). Since HVTT 105 is capable of withstanding substantially higher voltages than the components of voltage detector circuit 110, HVT power up detector 100 is capable of operating with either $V_H$ or $V_{CC}$ applied to power rail 125. In fact, $V_H$ may be a voltage level that would otherwise cause immediate catastrophic breakdown/failure (or cause slow deterioration and subsequent long term failure) of the components of voltage detector circuit 110 and other typical digital logic integrated with HVT power up detector 100.

Resistive elements R1 and R2 may be formed using any type of resistor. For example, resistors could be strips of resistive material, surface mount resistors, transistors appropriately biased to obtain a desired resistance, and the like. The type and form of resistive elements R1 and R2 may depend upon the process used to integrate the components of HVT power up detector 100 with other circuits.

Figure 2:
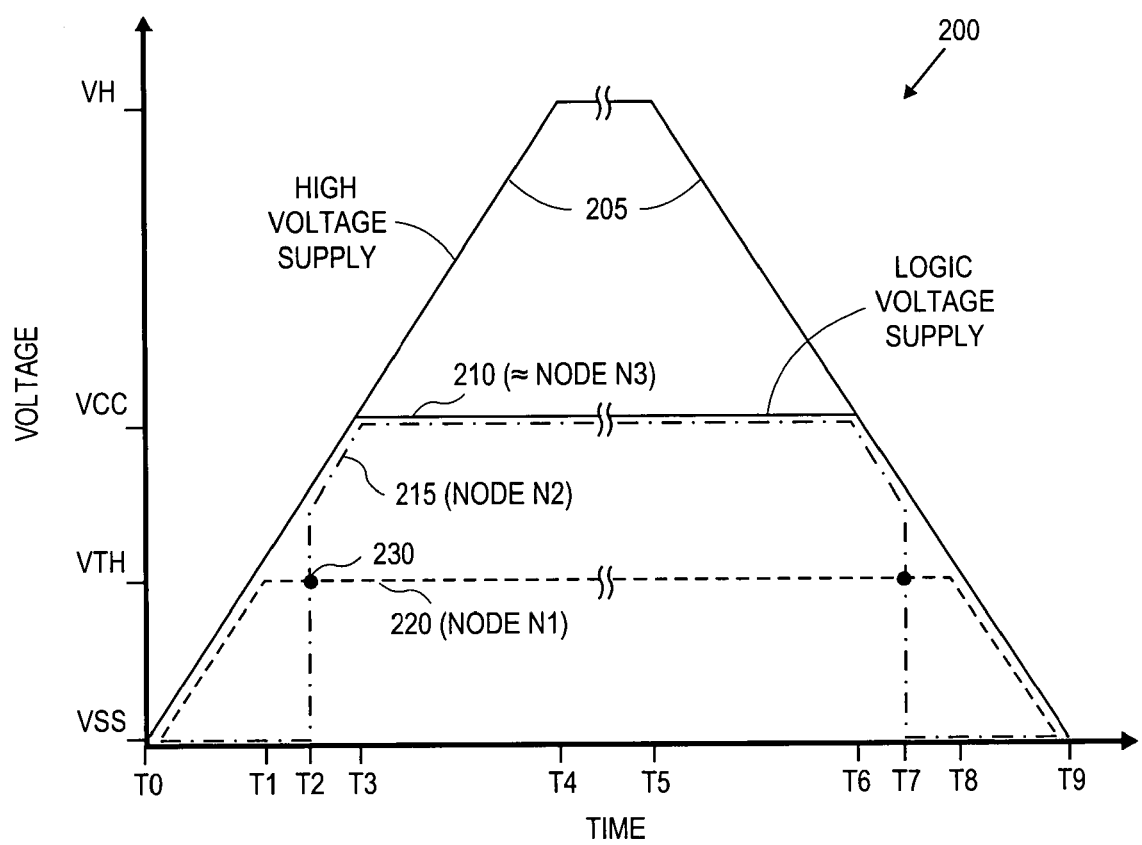
FIG. 2 is a line chart illustrating operation of a high voltage tolerant power up detector, in accordance with an embodiment of the present invention.

FIG. 2 is a line chart 200 illustrating operation of HVT power up detector 100, in accordance with an embodiment of the present invention. Line 205 represents the output voltage of a high voltage supply coupled to power rail 125 of HVT power up detector 100. Line 210 represents the output voltage of a logic voltage supply coupled to the gate of HVTT 105 (and perhaps coupled to power rail 125 in place of the high voltage supply). Lines 215 and 220 represent the time varying voltages at nodes N2 and N1, respectively, of HVT power up detector 100 in response to the voltage supplies.

As can be seen from line chart 200, at time T0 the high voltage supply is turned on and begins to rise monotonically towards $V_H$ along line 205. In FIG. 2, the logic voltage supply is also turned on at time T0 and begins to rise monotonically towards $V_{CC}$ along line 205. Between time T0 and T1, node N1 tracks the logic voltage supply as illustrated by line 220. However, at time T1 transistor T1 enters the saturation region of operation and the voltage at node N1 slumps over and runs substantially flat, no longer tracking the logic voltage supply.

Between time T0 and T2 the voltage at node N2 remains at $V_{SS}$ as transistor T2 has not yet turned on. In other words, prior to time T2 the gate-to-source voltage to transistor T2 has not exceed the threshold voltage for transitioning transistor T2 from "off" to conducting (or "on"). At time T2, transistor T2 begins conducting causing the voltage at node N2 to immediately rise towards the voltage at node N3 (and therefore approximately the voltage applied to the gate of HVTT 105). After time T2 node N2 tracks the logic voltage supply until time T7, which is after the logic voltage supply has turned off at time T6.

At time T3 the logic voltage supply reaches its maximum operating level $V_{CC}$ and diverges from line 205 along line 210. Point 230 represents the time at which the voltages of nodes N1 and N2 cross each other and the point at which the voltages on power rails 125 and 127 have reached the threshold logic voltage level $V_{TH}$. $V_{TH}$ represents a voltage at and above which digital logic is guaranteed to function properly. For example in a digital logic process where $V_{CC}$ is 1.3V, $V_{TH}$ may equal approximately 0.8V. Below 0.8V the digital logic may not resolve to the proper values at any given stage and therefore is not reliable.

The high voltage supply continues to rise along line 205 until it reaches its maximum operating voltage of $V_H$ at time T4. The high voltage supply continues at voltage $V_H$ during operation until it is turned off at time T5 and begins to drop. It should be appreciated that, if the logic voltage supply is coupled to power rail 125, then power rail 125 will track line 210, and if power rail 125 is coupled to the high voltage supply, then power rail 125 will track line 205.

At some time after the high voltage supply exceeds $V_{CC}$, the voltage applied to power rail 125 becomes sufficiently high enough to cause damage to regular digital logic. Typically, this detrimental voltage excess over $V_{CC}$ is about 30% above $V_{CC}$ and is often referred to as the "burn in voltage." If the high voltage supply is not isolated from voltage detector circuit 110 by HVTT 105, the excessive voltage would have a detrimental effect on the components of voltage detector circuit 110. This detrimental effect may result in a sudden catastrophic failure of voltage detector circuit 110 or a gradual degradation of voltage detector circuit 110. Accordingly, HVTT 105 enables HVT power up detector 100 to operate with either the logic voltage supply or the high voltage supply coupled to power rail 125.

Figure 3:
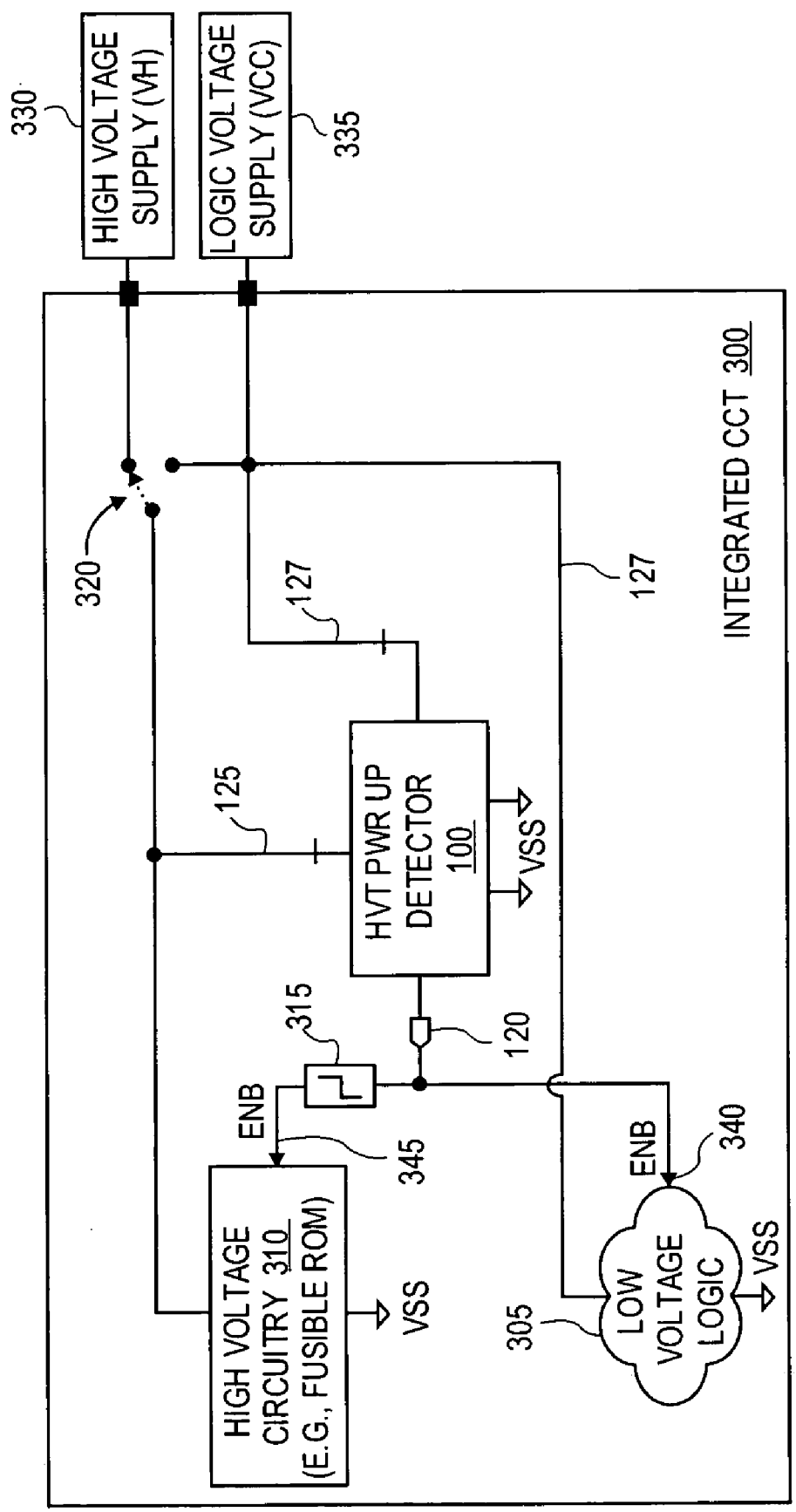
FIG. 3 is a block diagram illustrating a system implementing a high voltage tolerant power up detector, in accordance with an embodiment of the present invention.

FIG. 3 is a block diagram illustrating an integrated circuit ("IC") 300 using HVT power up detector 100, in accordance with an embodiment of the present invention. The illustrated embodiment of IC 300 includes HVT power up detector 100, low voltage logic 305, high voltage circuitry 310, voltage converter 315, and a switch 320.

IC 300 is powered by a high voltage supply 330 that generates the high level voltage $V_H$ once it obtains steady state operation. IC 300 is further powered by a logic voltage supply 335 that generates the logic level voltage $V_{CC}$ once it obtains steady state operation. High voltage supply 330 provides the supply voltage for high voltage circuitry 310 along power rail 125. Logic voltage supply 335 provides the supply voltage for low voltage logic 305 along power rail 127.

In one embodiment, high voltage circuitry 310 is fusible read only memory ("ROM") that is programmable (i.e., writable) using the high level voltage $V_H$ and readable using the logic level voltage $V_{CC}$. Accordingly, in one embodiment, power rail 125 is a dual voltage power rail capable of switching between high voltage supply 330 during write operations and logic voltage supply 335 during read operations. Low voltage logic 305 includes the majority of the logic that makes up IC 300. In particular, in one embodiment, low voltage logic 305 includes control logic for controlling write and read operations to the fusible ROM. For example, IC 300 may be a processor including the fusible ROM for storing code.

Output 120 of HVT power up detector 100 is coupled to an enable input 340 of low voltage logic 305 to enable/disable low voltage logic 305. HVT power up detector 100 ensures that low voltage logic 305 is disabled during power up (and power down) of logic voltage supply 335 when logic voltage supply 335 is generating a supply voltage less than the threshold logic level voltage $V_{TH}$, below which reliable operation of low voltage logic 305 cannot be guaranteed.

In one embodiment, output 120 of HVT power up detector 100 is further coupled to an enable input 345 of high voltage circuitry 310 to enable/disable high voltage circuitry 310 when logic voltage supply 335 is generating a supply voltage below the threshold logic level voltage $V_{TH}$. During read operations, enable input 345 ensures that high voltage circuitry 310 does not output an incorrect value due to insufficient voltage to operate high voltage circuitry 310. During write operations enable input 345 ensures that the fusible ROM is not written too before the control circuitry within low voltage logic 305 is ready to control the write operation. In an embodiment where enable input 345 is used during high voltage operation of high voltage circuitry 310, a voltage converter 315 may be placed between output 120 of HVT power up detector 100 and enable input 345 to compensate for the differing voltages.

It should be appreciated that including both enable input 340 and 345 may be redundant in some configurations and therefore only one or the other may be needed to provide adequate power up (and/or power down) control. Accordingly, embodiments of the present invention include one or both of enable inputs 340 and 345.

It should be appreciated that in operation when power rail 125 is coupled to high voltage supply 330, both high voltage supply 330 and logic voltage supply 335 must rise above the threshold logic level voltage $V_{TH}$ before HVT power up detector 100 will transition output signal 130 on output 120. In other words, node N3 of voltage detector circuit 110 will not rise above the threshold logic level voltage $V_{TH}$ unless both power rails 125 and 127 are above the threshold logic level voltage $V_{TH}$. Thus, HVT power up detector 100 acts as a power up detector (and power down detector) of both high voltage supply 330 and logic voltage supply 335.

Figure 4:
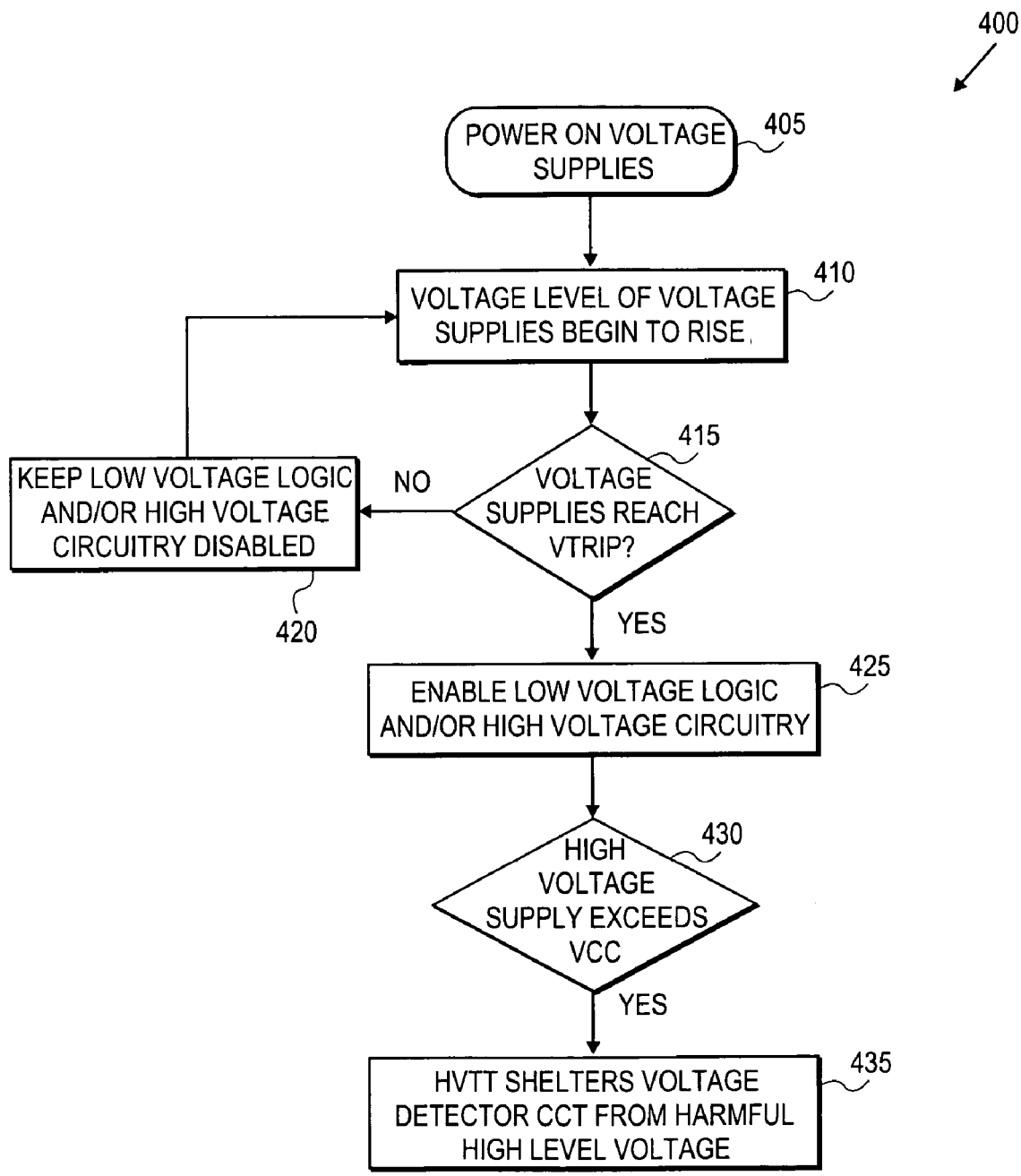
FIG. 4 is a flow chart illustrating a process to implement a high voltage tolerant power up detector, in accordance with an embodiment of the present invention.

FIG. 4 is a flow chart illustrating a process 400 for operating HVT power up detector 100, in accordance with an embodiment of the present invention. In a process block 405, high voltage supply 330 and logic voltage supply 335 are powered on. In a process block 410, the voltage levels output by high voltage supply 330 and logic voltage supply 335 begin to rise as load capacitances on power rails 125 and 127 are charged up.

Before high voltage supply 330 and logic voltage supply 335 reach a trip voltage level $V_{TRIP}$, HVT power up detector 100 maintains output signal 130 on output 120 such that low voltage logic 305 and/or high voltage circuitry 310 are disabled (process block 420). However, once high voltage supply 330 and logic voltage supply 335 reach $V_{TRIP}$ (decision block 415), HVT power up detector 100 enables low voltage logic 305 and/or high voltage circuitry 310 (process block 425). $V_{TRIP}$ is equal to or greater than the threshold logic voltage level $V_{TH}$.

In a decision block 430, as high voltage supply 330 continues to generate a rising supply voltage, high voltage supply 330 may exceed the steady state voltage of logic voltage supply 335 (e.g., logic level voltage $V_{CC}$). In a process block 435, once high voltage supply 330 exceeds logic level voltage $V_{CC}$, HVTT 105 begins to shelter voltage detector circuit 110 from the voltage on power rail 125 exceeding the voltage on power rail 127 (e.g., logic level voltage $V_{CC}$). Voltage detector circuit 100 includes components that are susceptible to damage due to excessive voltage on power rail 125, if not sheltered by HVTT 105.

It should be appreciated that if power rail 125 is coupled to logic voltage supply 335 via switch 320, then HVTT 105 need not shelter voltage detector circuit 110 from excessive voltages on power rail 125. Thus, embodiments of the present invention enable HVT power up detector 100 to safely operate with variable voltages applied to power rail 125, while still triggering output signal 120 at the same trip voltage level $V_{TRIP}$, regardless of the voltage applied to power rail 125.

As described above, HVT power up detector 100 may be incorporated into IC 300, as well as, various other integrated circuits. Descriptions of HVT power up detector 100 and IC 300 may be generated and compiled for incorporation into other integrated circuits, such as general purpose processors or various application specific integrated circuits ("ASICs"). For example, behavioral level code describing HVT power up detector 100 and IC 300, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe HVT power up detector 100 and IC 300.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
    a voltage detector circuit coupled to determine when a voltage supply is above a threshold logic level voltage; and
    a high voltage tolerant transistor ("HVTT") having a gate coupled to receive a logic level voltage and a source and a drain to couple between the voltage supply and the voltage detector circuit, the HVTT to shelter the voltage detector circuit from voltages above the logic level voltage when the voltage supply exceeds the logic level voltage, wherein the HVTT comprises a lightly doped drain negative metal oxide semiconductor ("LDDNMOS") transistor.

2. The apparatus of claim 1, wherein the HVTT is configured to shelter the voltage detector circuit from voltage levels high enough to damage the voltage detector circuit.

3. The apparatus of claim 2, wherein the source of the LDDNMOS transistor is coupled to the voltage detector circuit and the drain of the LDDNMOS transistor is to couple to the voltage supply.

4. The apparatus of claim 1, wherein the voltage detector circuit comprises:
a first current path including a first resistive element and a first transistor coupled in series;
a second current path including a second transistor and a second resistive element coupled in series, the first current path and the second current path coupled in parallel between the HVTT and a ground path; and
a voltage comparator having first and second inputs, the first input coupled to a first node between the first transistor and the first resistive element and the second input coupled to a second node between the second transistor and the second resistive element, the comparator to compare a first voltage of the first node against a second voltage of the second node.

5. The apparatus of claim 4, wherein the first transistor comprises an NMOS transistor having a drain and a gate coupled together.

6. The apparatus of claim 5, wherein the second transistor comprises a positive MOS ("PMOS") transistor having a gate coupled to the ground path.

7. The apparatus of claim 4, wherein the first and second resistive elements have resistances selected such that the first node and the second node have substantially equivalent voltages when the voltage supply provides a voltage approximately equal to the threshold logic level voltage.

8. The apparatus of claim 1, wherein the voltage detector circuit further comprises an output to enable low voltage logic when the voltage supply is above the threshold logic level voltage.

9. A method, comprising:
powering on a logic voltage supply coupled to low voltage logic, the logic voltage supply to generate a first supply voltage;
powering on a high voltage supply coupled to high voltage circuitry, the high voltage supply to generate a second supply voltage high enough to damage the low voltage logic, wherein the high voltage circuitry includes fusible read only memory("ROM");
generating an enable signal with a high voltage tolerant ("HVT") power up detector when the first supply voltage and the second supply voltage both exceed a threshold logic voltage level, the enable signal to enable operation of the low voltage logic; and
writing to the fusible ROM using the second supply voltage generated by the high voltage supply.

10. The method of claim 9, further comprising sheltering voltage detector components of the HVT power up detector not capable of tolerating the second supply voltage from a portion of the second supply voltage exceeding the first supply voltage using a high voltage tolerant transistor ("HVTT") coupled between the voltage detector components and the high voltage supply.

11. The method of claim 10, wherein the low voltage logic includes control logic to control the writing to the fusible ROM.

12. The method of claim 10, wherein generating the enable signal when the first supply voltage and the second supply voltage both exceed the threshold logic voltage level comprises:
driving a gate of the HVTT with the logic voltage supply;
driving a drain of the HVTT with the high voltage supply;
driving source current of the HVTT through a first current path and a second current path coupled in parallel between a source of the HVTT and a ground path, the first current path including a first resistive element and a first transistor coupled in series, the second current path including a second transistor and a second resistive element coupled in series; and
comparing a first voltage generated at a first node between the first resistive element and the first transistor against a second voltage generated at a second node between the second transistor and the second resistive element.

13. A machine-accessible medium having contained thereon a description of an integrated circuit, the integrated circuit comprising:
a voltage detector circuit coupled to determine when a voltage supply is above a threshold logic level voltage; and
a high voltage tolerant transistor ("HVTT") having a gate coupled to receive a logic level voltage and a source and a drain coupled between a power rail and the voltage detector circuit, the HVTT to shelter the voltage detector circuit from voltages on the power rail above the logic level voltage, wherein the voltage detector includes:
a first current path including a first resistive element and a first transistor coupled in series;
a second current path including a second transistor and a second resistive element coupled in series, the first current path and the second current path coupled in parallel between the HVTT and a ground path; and
a voltage comparator having first and second inputs, the first input coupled to a first node between the first transistor and the first resistive element and the second input coupled to a second node between the second transistor and the second resistive element, the comparator to compare a first voltage of the first node against a second voltage of the second node.

14. The machine-accessible medium of claim 13, wherein the HVTT comprises a lightly doped drain negative metal oxide semiconductor ("LDDNMOS") transistor and wherein the source is coupled to the voltage detector circuit and the drain is to couple to the power rail.

15. The machine-accessible medium of claim 13, wherein the power rail comprises a dual voltage power rail to switchably couple to a high voltage supply and a logic voltage supply.

16. An integrated circuit, comprising:
low voltage logic coupled to a first power rail and operable above a threshold logic level voltage, the first power rail to couple to a logic voltage supply to receive a logic level voltage;
high voltage circuitry coupled to a second power rail and operable at a high level voltage, the second power rail to couple to a high voltage supply to receive the high level voltage, wherein the second power rail comprises a dual voltage power rail to switchably couple to both the high voltage supply and the logic voltage supply, the high level voltage above the logic level voltage and detrimental to the low voltage logic; and
a high voltage tolerant ("HVT") power up detector coupled to the first power rail and to the second power rail, the HVT power up detector to enable the low voltage logic when the first power rail is above a threshold logic level voltage, HVT power up detector to receive the high level voltage without detriment.

17. The integrated circuit of claim 16, wherein the HVT power up detector is further coupled to enable the high voltage circuitry when the logic voltage supply is above the threshold logic level voltage.

18. The integrated circuit of claim 17, wherein the high voltage circuitry comprises fusible read only memory ("ROM") writable at the high level voltage and readable at the logic level voltage.

19. The integrated circuit of claim 16, wherein the HVT power up detector comprises:
    a voltage detector circuit to generate an output to enable the low voltage logic; and
    a high voltage tolerant transistor ("HVTT") having a gate coupled to the first power rail and a source and a drain to couple between the second power rail the voltage detector circuit, the HVTT to shelter the voltage detector circuit from voltages above the logic level voltage.

20. The integrated circuit of claim 19, wherein the HVTT comprises a lightly doped drain negative metal oxide semiconductor ("LDDNMOS") transistor and wherein the source is coupled to the voltage detector circuit and the drain is to couple to the second power rail.

21. The integrated circuit of claim 20, wherein the voltage detector comprises
    a first current path including a first resistive element and a first transistor coupled in series;
    a second current path including a second transistor and a second resistive element coupled in series, the first current path and the second current path coupled in parallel between the HVTT and a ground path; and
    a voltage comparator having first and second inputs, the first input coupled to a first node between the first transistor and the first resistive element and the second input coupled to a second node between the second transistor and the second resistive element, the comparator to compare a first voltage of the first node against a second voltage of the second node.

* * * * *